United States Patent [19]

Vora

[11] Patent Number: 4,617,071
[45] Date of Patent: Oct. 14, 1986

[54] METHOD OF FABRICATING ELECTRICALLY CONNECTED REGIONS OF OPPOSITE CONDUCTIVITY TYPE IN A SEMICONDUCTOR STRUCTURE

[75] Inventor: Madhukar B. Vora, Los Gatos, Calif.

[73] Assignee: Fairchild Semiconductor Corporation, Cupertino, Calif.

[21] Appl. No.: 315,553

[22] Filed: Oct. 27, 1981

[51] Int. Cl.[4] .................. H01L 21/441; H01L 21/385
[52] U.S. Cl. ...................................... 148/188; 29/578; 29/580; 29/591
[58] Field of Search ................ 29/577 C, 576 E, 578, 29/580, 591; 148/175, 187, 188

[56] References Cited

U.S. PATENT DOCUMENTS

| | | | |
|---|---|---|---|
| 3,648,125 | 3/1972 | Peltzer | 148/187 X |
| 4,322,882 | 4/1982 | Vora | 148/187 X |
| 4,398,338 | 8/1983 | Tickle et al. | 148/175 X |
| 4,418,468 | 12/1983 | Vora et al. | 148/174 X |
| 4,488,350 | 12/1984 | Vora et al. | 148/188 X |
| 4,512,075 | 4/1985 | Vora et al. | 148/190 X |

FOREIGN PATENT DOCUMENTS 0021400 1/1981 European Pat. Off. .

OTHER PUBLICATIONS

IBM Technical Disclosure Bulletin, vol. 23, Dec. 1980, pp. 2727-2729, Howard et al; "Bipolar Memory Cell With Polysilicon-Metal Cross-Coupling".
IBM Technical Disclosure Bulletin, vol. 21, No. 12, May 1979, p. 4886, Berger et al; "Cross-Coupled Flip-Flop Transistors With Stacked Interconnection Lines".

Primary Examiner—George T. Ozaki
Attorney, Agent, or Firm—Carl L. Silverman; David H. Carroll; Robert C. Colwell

[57] ABSTRACT

The two transistors of a bipolar flip-flop structure are interconnected by using a polycrystalline silicon/metal silicide sandwich structure. The polycrystalline silicon is doped to correspond to the underlying regions of the transistor structures, and undesired PN junctions created thereby are eliminated by depositing refractory metal silicide on the upper surface of the polycrystalline silicon.

14 Claims, 8 Drawing Figures

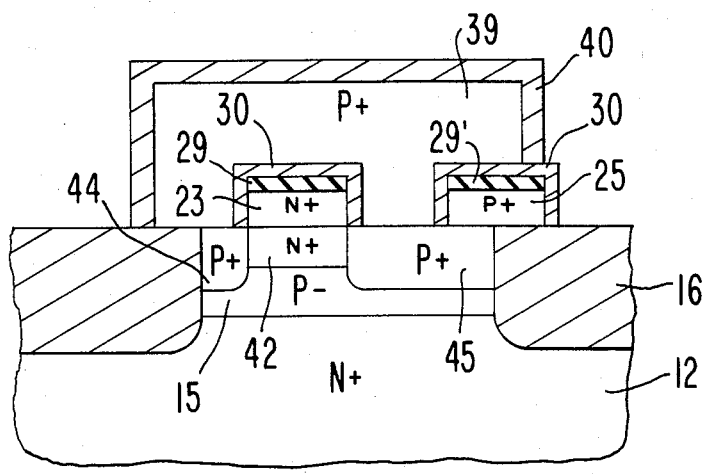
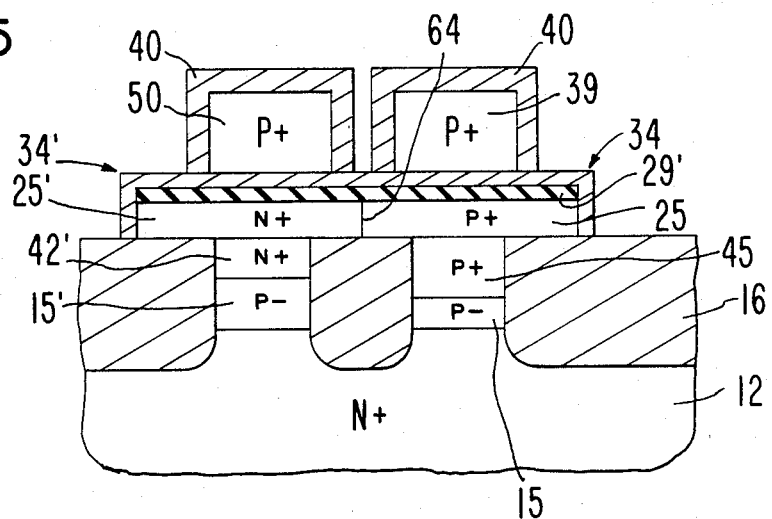
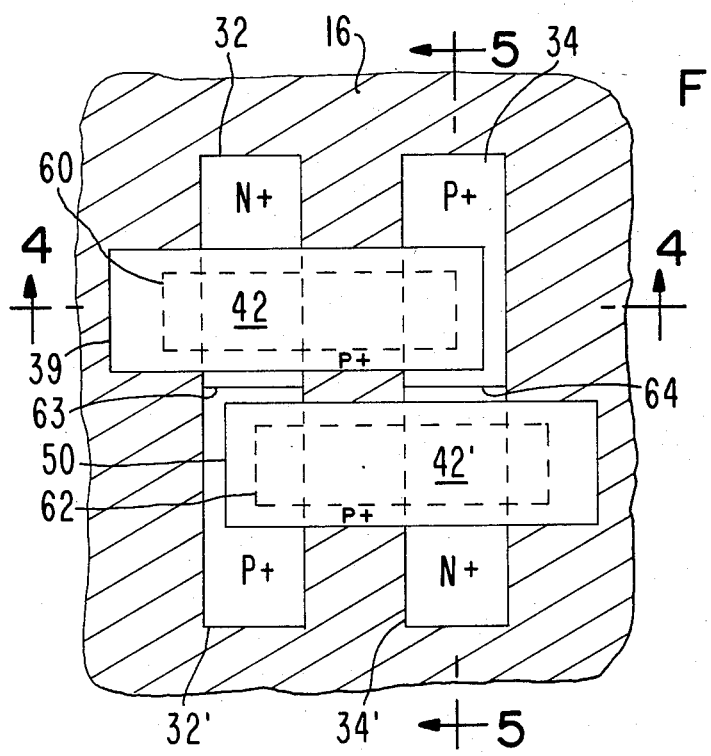

METHOD OF FABRICATING ELECTRICALLY CONNECTED REGIONS OF OPPOSITE CONDUCTIVITY TYPE IN A SEMICONDUCTOR STRUCTURE

BACKGROUND OF THE INVENTION

1. Field of the Invention

This invention relates to integrated circuits and methods of manufacturing them, and in particular to an unusually compact bipolar transistor flip-flop structure having polycrystalline silicon interconnections, and a method of fabricating it.

2. Description of the Prior Art

Several types of integrated bipolar transistor flip-flops are known. In such structures the transistors comprising the flip-flop are electrically connected together by metal and/or polycrystalline silicon electrodes. A typical structure is shown in Ronald Rathbone et al. "1024 bit ECL RAM with 15 ns Access Time," International Solid State Circuits Conference 1976, pages 188–89. All such structures, however, have typically occupied an undesirably large area of the semiconductor material because of the difficulty of compactly interconnecting the transistors in the desired manner.

SUMMARY OF THE INVENTION

This invention provides a more compact bipolar transistor flip-flop than prior art structures. In particular, this invention makes possible the fabrication of very large numbers of flip-flops on a relatively small single silicon substrate. For example, using my invention without improving design rules over those presently used by integrated circuit manufacturers, approximately one-quarter million flip-flops could be fabricated on a single die approximately 200 mils square. Future improvements in integrated circuit fabrication technology will allow the fabrication of even larger numbers of flip-flops of my invention in an equally small area.

In one embodiment the integrated circuit structure of this invention comprises a semiconductor substrate having a surface; first and second transistor structures, each having both a first region of first conductivity type and a second region of opposite conductivity type adjacent the surface of the substrate; first and second connections of semiconductor material disposed on the surface of the substrate electrically isolated from each other, each connection extending between a first conductivity type region in one of the first and second transistors and an opposite conductivity type region in the other of the first and second transistors, separate portions of each of the first and second connections being of conductivity type to correspond to the conductivity type of whichever of the first or second region is disposed beneath that portion of the connection; a first layer of electrically conductive material disposed on the first connection to electrically connect the separate portions of the first connection to each other, and a second layer of electrically conductive material disposed on the second connection to electrically connect the separate portions of the second connection to each other.

According to another embodiment of the invention a method of fabricating electrically connected regions of opposite conductivity type in the substrate comprises the steps of depositing a layer of semiconductor material on a substrate; introducing first conductivity type impurity into a first portion of the layer; introducing opposite conductivity type impurity into a second portion of the layer; depositing a layer of electrically conductive material over the layer of semiconductor material; and transferring some of the first conductivity type impurity and the opposite conductivity type impurity from the layer of semiconductor material into the substrate to thereby create electrically connected regions of opposite conductivity type in the substrate.

The term substrate is used herein in two ways. In its broader sense substrate refers to an underlying structure of arbitrary complexity. Used in this manner a substrate may contain numerous passive and/or active electronic components. For example, used in this sense, in FIG. 2 layer 21 is disposed on a "substrate." Another sense in which substrate is used in this application is to refer only to the monocrystalline undoped silicon wafer used as a starting point for the fabrication of an integrated circuit. In this manner in FIG. 2 region 10 is termed a "substrate." The context in which the word appears will indicate the intended meaning.

BRIEF DESCRIPTION OF THE DRAWINGS

FIG. 4 is a subsequent cross-sectional view after selected etching of the structure shown in FIG. 3 and deposition of an additional layer of polycrystalline silicon.

FIGS. 4, 5, and 6 show the completed bipolar transistor flip-flop with:

FIG. 4 showing a first cross-sectional view;

FIG. 5 showing a second cross-sectional view; and

FIG. 6 showing a top view of the structures depicted in FIGS. 4 and 5.

FIG. 8 is an equivalent electrical schematic of the integrated circuit structure shown in FIGS. 4, 5, 6, and 7.

DETAILED DESCRIPTION OF THE PREFERRED EMBODIMENTS

Figure 1:
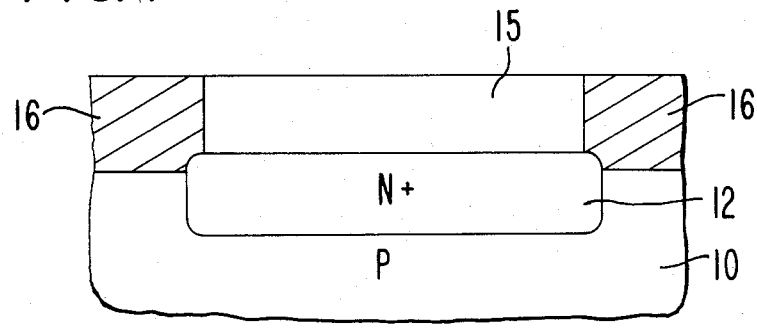
FIG. 1 is a cross-sectional view of an integrated circuit structure which may be fabricated utilizing known techniques.

FIG. 1 illustrates a cross-sectional view of a semiconductor structure including a P conductivity type silicon substrate 10, an N conductivity type buried layer 12, intrinsic epitaxial silicon layer 15, and silicon dioxide insulation 16. In the preferred embodiment of this invention substrate 10 will have a resistivity of 2 ohm-centimeters while buried layer 12 will be doped with N conductivity type impurities to a concentration of $10^{19}$ atoms per cubic centimeter. The structure shown in FIG. 1 may be fabricated using well-known semiconductor fabrication techniques, for example, as taught by Douglas Peltzer in U.S. Pat. No. 3,648,125 entitled "Method of Fabricating Integrated Circuits With Oxidized Isolation and the Resulting Structure."

Figure 2:
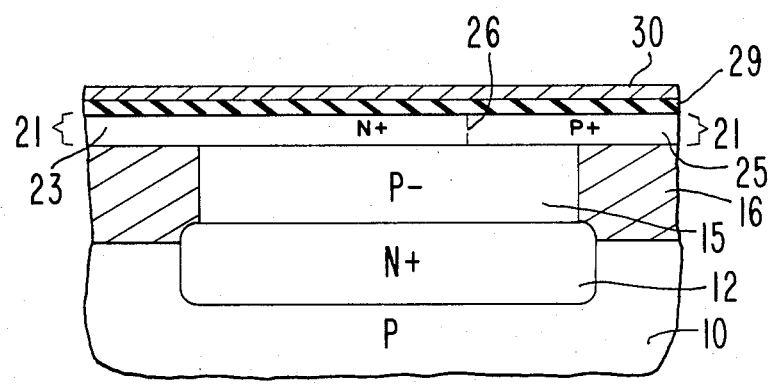
FIG. 2 is a cross-sectional view of the structure shown in FIG. 1 after forming the base regions of the NPN transistors, depositing a layer of polycrystalline silicon and doping it, and depositing a layer of metal silicide.

As shown by FIG. 2, epitaxial layer 15 is then doped with a suitable P conductivity type impurity, such as boron, to a concentration of $5 \times 10^{16}$ atoms per cubic centimeter. As will be explained, the lightly doped P type region 15 will serve as the intrinsic base for subsequently formed NPN transistors. Layer 15 may be most readily doped by implanting boron ions into the epitaxial layer using a dose of $10^{13}$ atoms per square centimeter and an implant energy of 150 kev.

Figure 3:
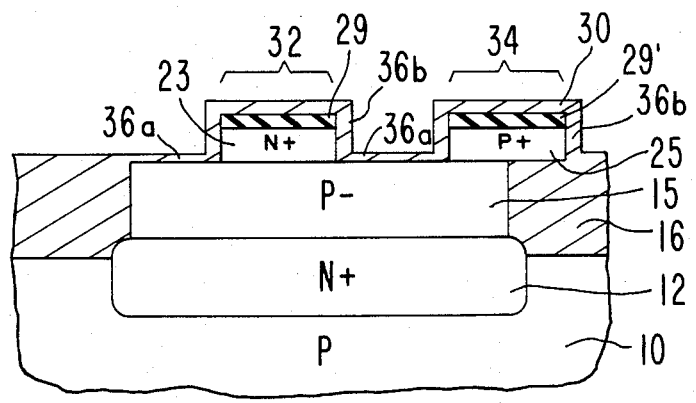
FIG. 3 is a subsequent cross-sectional view after defining selected regions in the polycrystalline silicon and oxidizing those regions.

As also shown in FIG. 2, once epitaxial layer 15 is suitably doped, a layer of polycrystalline silicon 21 approximately 5000 Angstroms thick is deposited across the upper surface of the structure, for example, using chemical vapor deposition. The polycrystalline silicon 21 is then masked using well-known techniques and N and P conductivity type impurities introduced as depicted in FIG. 2. The N type portion 23 of layer 21 will be doped to a concentration of approximately $10^{20}$ atoms per cubic centimeter of arsenic, while the P type portion 25 of layer 21 will be doped with approximately $10^{19}$ atoms per cubic centimeter of boron. The precise location of the junction 26 between regions 23 and 25 is not critical because this junction is later removed (see FIG. 3). Moreover, only those portions of layer 21 which are not subsequently removed need be doped. As shown by FIG. 3, only two portions 32 and 34 of layer 21 remain after subsequent process steps and these are the only portions of layer 21 which need be doped.

At the same time the regions 23 and 25 are doped, other portions of layer 21 in front of the cross-section shown in FIG. 2 are also doped. These regions 32' and 34' are shown most clearly in FIG. 6. As shown there, region 32' will be doped with an opposite conductivity type to region 32 and region 34' will be doped with opposite conductivity to region 34. The function of opposite conductivity type regions 32' and 34' is discussed in conjunction with FIG. 5.

Across the upper surface of polycrystalline silicon 21, a layer of metal silicide 29 is formed. In the preferred embodiment silicide layer 29 comprises a refractory metal silicide, such as tantalum silicide or tungsten silicide, approximately 1000 Angstroms thick which is fabricated by chemical vapor deposition. On the upper surface of silicide layer 29 a layer of silicon dioxide 30 approximately 3000 Angstroms thick is fabricated by heating silicide 29 to a temperature of 800° C. for 3 hours in a steam ambient. As will be described in conjunction with FIG. 5, silicide 29 will be used to "short" P-N junctions created in polycrystalline silicon 25. Oxide 30 will protect silicide 29 from subsequent processing steps which are described in conjunction with FIGS. 3 and 4.

As shown by FIG. 3, the structure in FIG. 2 is then masked and etched using known photolithographic and chemical or plasma etching techniques to define strips (extending into and out of the illustration) of polycrystalline silicon 23 and 25 together with overlying silicide 29 and 29' and silicon dioxide 30. The strips 32 and 34 may be etched using any desired technique, for example with a plasma which comprises carbon tetrafluoride to etch oxide 30, and carbon tetrachloride to etch silicide 29 and polycrystalline silicon 23 and 25.

After definition of strips 32 and 34, the resulting integrated circuit structure is heated to a temperature of 1000° C. for 60 minutes in steam. In this manner a layer of silicon dioxide 36 will be formed across the surface of epitaxial layer 15 and on the sides of strips 32 and 34. The silicon dioxide 30 on the upper surface of the strips 32 and 34 will become thicker. Because the heavily doped polycrystalline silicon regions 23 and 25 will oxidize faster than the lightly doped region 15, a thicker layer of silicon dioxide 36b will form on the sides of strips 32 and 34 than layer 36a on the surface of epitaxial layer 15. In the preferred embodiment layer 36b will be approximately 1500 Angstroms thick while layer 36a will be approximately 500 Angstroms thick. The structure shown in FIG. 3 is then etched in a well-known manner, for example, with a plasma containing carbon tetrafluoride and hydrogen to remove the thin oxide 36a on the surface of epitaxial layer 15. Because of the different thicknesses of layers 36a and 36b some of layer 36b will remain on the sides of polycrystalline silicon regions 23 and 25 after all of layer 36a is removed. The oxide 36b which remains on the sides of the polycrystalline silicon regions 23 and 25 and oxide 30 on top of silicide 29 and 29' will electrically isolate these regions from subsequently formed layers overlying the strips 32 and 34.

As shown in FIG. 4 a relatively thick layer of polycrystalline silicon 39, typically on the order of 6000 Angstroms thick, is then deposited across the upper surface of the structure. In the preferred embodiment layer 39 is doped with P conductivity type impurity, for example, boron, to an impurity concentration of $10^{19}$ atoms per cubic centimeter. Polycrystalline silicon layer 39 may be fabricated using chemical vapor deposition and doped at the same time it is deposited. Using well-known photolithographic techniques, polycrystalling slicon 39 is masked and defined, for example, by plasma etching. In the preferred embodiment polycrystalline silicon 39 completely covers all of epitaxial silicon 15 except where polycrystalline silicon regions 23 and 25 and silicon dioxide 36 overlie layer 15.

The resulting structure is then oxidized by heating it to a temperature of 1000° C. for 1 hour to create silicon dioxide layer 40. During this relatively long thermal process, N conductivity type impurity from polycrystalline silicon 23 will diffuse into epitaxial layer 15 to create N type region 42. At the same time P conductivity type impurity from both polycrystalline silicon 25 and 39 will diffuse into epitaxial silicon 15 to create P conductivity type regions 44 and 45. N type region 42 comprises the collector of an inverted NPN transistor having emitter 12 and base 15. The P conductivity type dopant in the upper portions of epitaxial silicon 15 outside of collector 42 lowers the resistance of the P type base 15.

Figure 7:
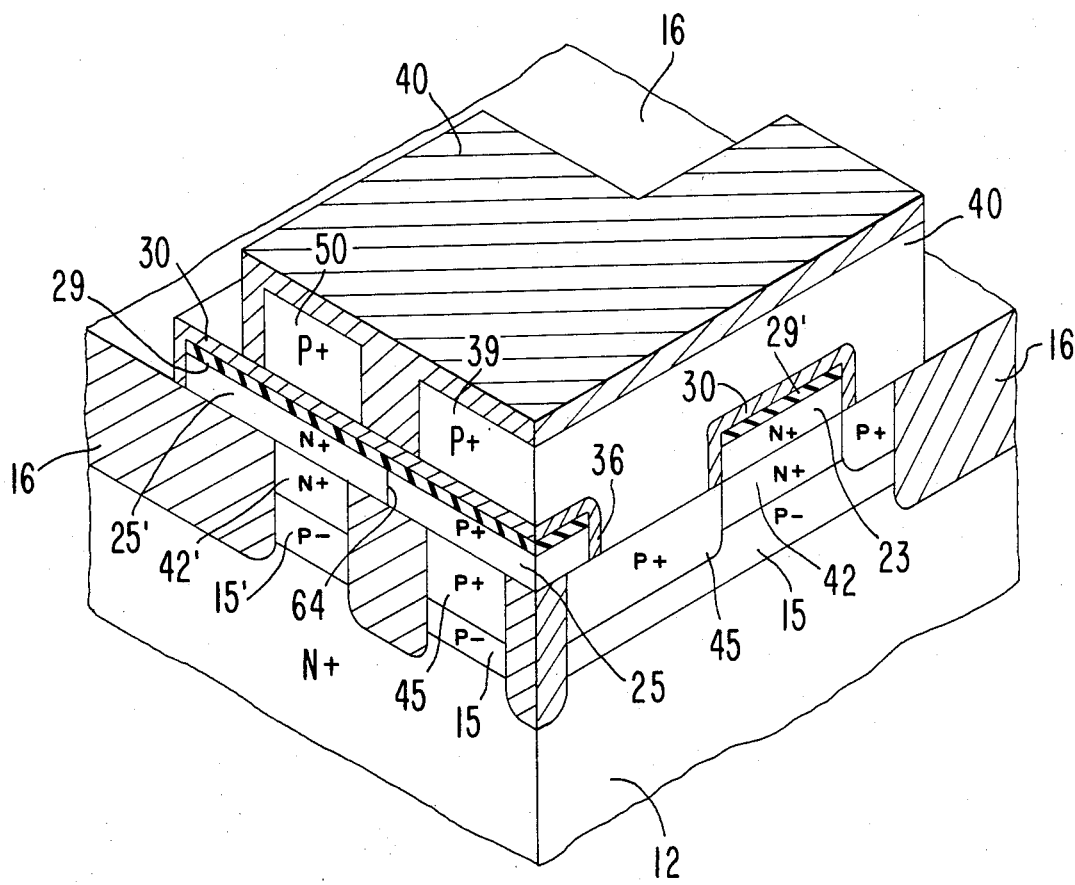
FIG. 7 is a perspective view of the structure shown in FIGS. 4, 5 and 6.

The completed integrated circuit structure is shown in three views in FIGS. 4, 5 and 6, and in perspective in FIG. 7. FIG. 5 is a cross-section taken at right angles with respect to FIG. 4. FIG. 6, a top view of the completed structure, shows the relationship of FIGS. 4 and 5. FIG. 7 shows the completed structure prior to formation of any desired passivating layers or electrical connections.

In FIG. 6, dashed line 60 designates the outer boundary of a first epitaxial silicon pocket surrounded by silicon dioxide 16. Dashed line 62 designates the boundary of a second such pocket. A first transistor is formed in region 60 (and shown in FIG. 4), while a similar second transistor structure is formed within region 62. In FIGS. 5 and 6, the strips are designated 32 and 34 at the end shown in cross-section in FIG. 4, and 32' and 34' at the opposite end. The polycrystalline silicon 23 or 25 underlying the silicide 29 or 29' at that end 32' and 34' of each strip is of opposite conductivity to the polycrystalline silicon 23 or 25 at the other end 32 or 34 of the strip. The opposite conductivity type polycrystalline silicon 25' is shown more clearly in FIG. 5. The regions of both N and P conductivity type in each strip 32 and 34 thereby create P-N junctions 63 and 64 approximately halfway along the length of strips 32 and 34, respectively. Metal silicide 29 short circuits P-N junction 63 by electrically connecting N type region 23 to P type region 23'; and silicide 29' short circuits P-N junction 64 by electrically connecting P type region 25 to N type region 25'.

Polycrystalline silicon 25' is electrically connected to, and was the source of dopant for, the collector 42' of the transistor formed in region 62 of epitaxial layer 15, while buried layer 12 and epitaxial layer 15 function as emitter and base, respectively. Polycrystalline silicon 25 is electrically connected to the base 15 via the P type region 45 in the first transistor, which is formed within region 60 of the epitaxial layer 15. In a similar manner region 23 connects to the N type collector 42 of the first transistor, while P type polycrystalline silicon 23' (not shown) connects to the base of the second transistor. Polycrystalline layers 39 and 50 reduce the base resistances of the respective two transistors.

FIG. 8 is an electrical schematic showing the equivalent discrete circuit fabricated by the integrated circuit structure shown in FIGS. 4–7. FIG. 8 illustrates the electrical paths between various components shown in FIGS. 4–7. For example, the N type collector 42 of the first transistor Q1 is connected to N type polycrystalline silicon region 23, which is connected by metal silicide layer 29 to P type polycrystalline silicon region 23', and in turn to the base 15' of the second transistor Q2. Similarly, collector 42' of the second transistor Q2 is connected to N type polycrystalline silicon 25', metal silicide layer 29', P type polycrystalline silicon 25, base contact 45, and finally to base 15 of the first transistor Q1. Buried layer 12 provides the commonly coupled emitters of both the first and second transistors Q1 and Q2.

As evident from FIG. 7, the structure of the bipolar transistor flip-flop of this invention, together with the method of manufacturing it, enable the creation of a very compact flip-flop. Using available integrated circuit technology the flip-flop may be fabricated in about 100 square micrometers, thereby enabling fabrication of more than a quarter million such flip-flops on a die 200 mils square.

Although embodiments of the process and structure of this invention have been described above, it will be apparent to those skilled in the art that numerous variations and modifications, such as changing the conductivity types of the various regions, may be made without departing from the scope of the invention as set forth in the appended claims.

What is claimed is:

1. A method of fabricating electrically connected regions of opposite conductivity type in a substrate comprising:
    depositing a layer of semiconductor material on the substrate, a first portion of the layer being first conductivity type, and a second portion of the layer being opposite conductivity type;
    depositing a layer of electrically conductive material over the layer of semiconductor material; and
    diffusing some of the first conductivity type impurity and some of the opposite conductivity type impurity from the layer of semiconductor material into the substrate to thereby create electrically connected regions of opposite conductivity in the substrate.

2. A method as in claim 1 wherein the layer of semiconductor material comprises polycrystalline silicon.

3. A method as in claim 2 wherein the polycrystalline silicon is doped with both P and N conductivity type impurities.

4. A method as in claim 1 wherein the step of depositing a layer of electrically conductive material comprises depositing a layer of a metal silicide.

5. A method as in claim 4 wherein the metal silicide comprises a refractory metal silicide.

6. A method as in claim 1 wherein the step of diffusing comprises heating the layer of semiconductor material and the substrate.

7. A method as in claim 1 wherein the layer of electrically conductive material and the layer of semiconductor material are selectively etched to form at least two strips, each strip including a portion of the layer of semiconductor material and an overlying portion of the layer of electrically conductive material.

8. A method as in claim 7 further comprising the step of forming an oxide of the layer of semiconductor material over each of the at least two strips.

9. A method as in claim 8 further comprising the step of forming a layer of polycrystalline silicon on the oxide after the step of forming the layer of the oxide.

10. A method as in claim 9 wherein the layer of polycrystalline silicon is deposited on selected portions of the substrate and on the at least two strips.

11. A method as in claim 7 wherein the semiconductor material comprises polycrystalline silicon.

12. A method as in claim 11 wherein each strip comprises both P and N conductivity type polycrystalline silicon.

13. A method as in claim 12 wherein each strip includes a P-N junction which is shorted by the electrically conductive material.

14. A method of fabricating electrically connected regions of opposite conductivity type in a substrate comprising:
    depositing a layer of polycrystalline silicon on the substrate;
    introducing both P and N conductivity type impurities into the layer of polycrystalline silicon;
    depositing a layer of a metal silicide on the layer of polycrystalline silicon;
    selectively removing portions of the layers of polycrystalline silicon and the metal silicide to form a strip including a first region of polycrystalline silicon of first conductivity type and a second region of polycrystalline silicon of opposite conductivity type which are electrically connected by the layer of metal silicide;
    oxidizing the strip;
    depositing a second layer of polycrystalline silicon which is doped with first conductivity type impurity across the strip; and
    diffusing some of the first conductivity type impurity and some of the opposite conductivity type impurity from each of the first and second layers of polycrystalline silicon into the substrate.

* * * * *